United States Patent [19]
Hirose et al.

[11] Patent Number: 4,672,577
[45] Date of Patent: Jun. 9, 1987

[54] THREE-DIMENSIONAL INTEGRATED CIRCUIT WITH OPTICALLY COUPLED SHARED MEMORIES

[75] Inventors: Masataka Hirose; Masamichi Yamanishi; Yukio Osaka; Tadashi Ae; Tadao Ichikawa; Noriyoshi Yoshida; Ikuo Suemune, all of Hiroshima, Japan

[73] Assignee: Hiroshima University, Hiroshima, Japan

[21] Appl. No.: 702,139

[22] Filed: Feb. 15, 1985

[30] Foreign Application Priority Data

Jun. 18, 1984 [JP] Japan ................................ 59-123918

[51] Int. Cl.⁴ .............................................. G11C 11/42
[52] U.S. Cl. ......................................... 365/114; 357/30
[58] Field of Search ................... 365/106, 114, 183; 307/304; 357/30

[56] References Cited

U.S. PATENT DOCUMENTS 4,603,401 7/1986 Coon .................................... 365/114

Primary Examiner—Terrell W. Fears
Attorney, Agent, or Firm—Spencer & Frank

[57] ABSTRACT

Adjacent memory layers of a multi-layered integrated device as optically coupled, so that data written on one layer can be copied onto its adjacent layers through the optical coupling.

8 Claims, 5 Drawing Figures

THREE-DIMENSIONAL INTEGRATED CIRCUIT WITH OPTICALLY COUPLED SHARED MEMORIES

BACKGROUND OF THE INVENTION

1. Field of the Invention

This invention relates to a three-dimensional integrated memory device having a plurality of memory capacitors which capacitors are switched on and off by transistors. More particularly, the invention relates to a three-dimensional integrated device with optically coupled shared memories, which device is made of memory layers carrying memory cells and optical coupling means so that the memory cells of the adjacent memory layers are optically coupled and the thus coupled memory cells share common data by copying them with each other, whereby time delay between memory cells is minimized by the optical coupling means of simple construction for improving the processing of the integrated device.

2. Description of the Prior Art

Generally speaking, in graphic data processing and information processing which involves pattern recognition such as speech recognition, a large number of processing operations are effected in parallel in order to, for instance, repeatedly collate the object information pattern to be processed against a number of standard patterns of different kinds. The parallel operations are necessary to speed up processing of graphic data and other pattern information. To ensure a high speed in such parallel processing operations, it is practiced to run a large number of processors in parallel while coupling the contents of the memories of the parallel processors to each other, so that similar information processing operations can be effected simultaneously, and a shared memory device is required to facilitate such parallel operations.

However, the conventional large scale integration (LSI) technology provides only two-dimensional integration of circuit elements, and wiring for connecting the elements in the two-dimensional integrated circuit tends to cause a long time delay in signal transmission therethrough. In fact, the more complicated the integrated circuit is, the longer the time delay is. Thus, the conventional LSI technology has a shortcoming in that the time delay in the signal transmission therein hampers the speedup of the information processing by the above-mentioned parallel operations.

SUMMARY OF THE INVENTION

Theretofore, an object of the invention is to obviate the above-mentioned shortcoming of the prior art by providing a three-demensional integrated device, which device comprises a plurality of two-dimensional integrated circuit memory layers overlaid one over the other while coupling the adjacent memory layers, so as to interconnect circuit elements or memory cells of the integrated device in a three-dimensional fashion. Whereby, the long time delay of signal transmission among circuit elements, or memory cells, in the conventional two-dimensional memory layers is avoided. The coupling distance between circuit elements or memory cells on adjacent memory layers in the integrated device of the invention is minimized, so that the signal transmission in the integrated device through such coupling is speeded up sufficiently for effecting the parallel operations in processing pattern information and graphic data.

Another object of the invention is to provide a three-dimensional integrated device in which circuit elements or memory cells on the adjacent two-dimensional memory layers are optically coupled, by juxtaposing an optical combination of a light emitter element and a light-sensitive switch element next to each circuit element or memory cell one each two-dimensional memory layer, while aligning the optical combinations of the adjacent two-dimensional memory layers so as to face to each other. With the optical combinations thus disposed, the circuit elements or memory cells of the adjacent memory layers are coupled through a minimum distance without any metallic wiring.

A preferred embodiment of the three-dimensional integrated device with optically coupled shared memories according to the present invention comprises a plurality of memory layers overlaid one over the other with insulating layers inserted therebetween. Each of the memory layers has a plurality of memory cells, each cell being made of a capacitor which is switchable by a transistor, address lines adapted to selectively make circuit to memory cells corresponding thereto, and data lines carrying a datum in the form of charge that is transferable to and from the memory cell through the transistor in response to actuation of the address line corresponding to that memory cell.

An optical combination made of a light emitter element and a light-sensitive switch element is juxtaposed to each of the memory cells. The optical combinations of adjacent memory layers are aligned so as to be visible one from the other. A bias line means is associated with each optical combination, and each bias line means is adapted to be selectively actuated so as to cause the light emitter element to emit light depending on the datum stored in the corresponding memory cell and to cause the light-sensitive switch to close circuit upon receiving light from the adjacent memory layer, whereby the datum in the cell of one memory layer is copied onto the corresponding cell of its adjacent memory layer.

The transistor of the memory cell is, for instance, a field effect transistor having a source connected to the capacitor, a gate connected to the address line, and a drain connected to the data line. An example of the above-mentioned bias line means consists of a data-transfer line facing the drain of the transistor of the corresponding cell, and a data-copy line connected to one terminal of the light-sensitive switch element. The opposite terminal of the light-sensitive switch element is connected to the drain of the transistor. The light emitter element is disposed between the data-transfer line and the drain so as to emit light when both of the data-transfer line and the drain are charged. The data-copy line carries a datum to be transferred to the corresponding cell only when the light-sensitive switch element closes the circuit between terminals thereof.

BRIEF DESCRIPTION OF THE DRAWINGS

For a better understanding of the invention, reference is made to the accompanying drawings, in which.

Throughout different views of the drawings, 1 is an address line, 2 is a data line, 3 is a memory capacitor, 4 is a MOS field effect transistor, 5 and 5a are insulation layers, 6 is substrate made of a semiconductor layer, 7 is a light emitter element, 8 is a light-sensitive switch element, 9 is a data-transfer line, 10 is a data-copy line, 11 is an (i−1)th memory layer with insulation, 12 is an ith memory layer with insulation, 13 is light, 14 is an overall control CPU, 15 is a CPU, 16 is an optical loop, D is a drain zone, G is a gate electrode, S is a source zone, $D_a$ is a conductive zone, and $E_1$ and $E_2$ are conductive films.

DESCRIPTION OF THE PREFERRED EMBODIMENTS

Figure 2:
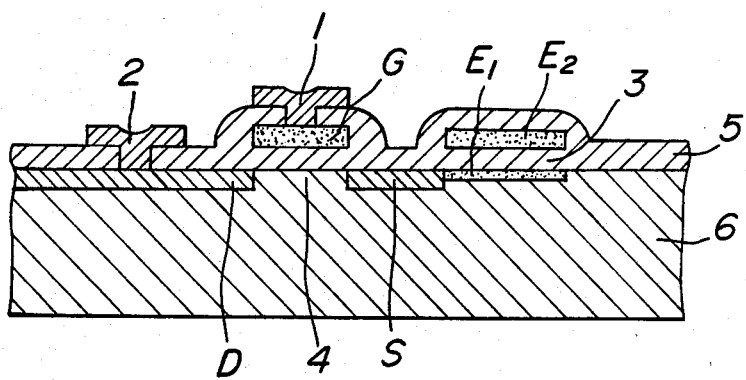
FIG. 2 is a schematic sectional view of a one-MOS dynamic memory cell of the prior art.

Before entering the details of the three-dimensional integrated device with optically coupled shared memories according to the invention, a memory cell of the prior art as the basis for the development of the invention will be briefly reviewed by referring to FIG. 2.

FIG. 2 shows a schematic sectional view of a so-called one-MOS dynamic memory cell. A drain zone D and a source zone S are formed on the surface of a semiconductor substrate 6 by doping an impurity at suitable surface portions thereof. The substrate 6 is made of, for instance, a silicon semiconductor film. As one electrode of a memory capacitor 3, a conductive film $E_1$ is deposited on the surface of the semiconductor substrate 6 so that the conductive film $E_1$ is electrically connected to the source zone S. An insulation layer 5, such as a silicon oxide ($SiO_2$) layer, is deposited on the top surface of the semiconductor substrate 6, so as to cover the above drain zone D, the source zone S, and the conductive film $E_1$.

To fabricate a MOS type field effect transistor 4, a gate electrode G is formed in the insulation layer 5 at a portion which bridges the drain zone D with the source zone S. A grounded conductive film $E_2$ is buried in the insulation layer 5, so that the grounded conductive film $E_2$ faces the above-mentioned conductive film $E_1$ on the surface of the semiconductor substrate 6 with a part of the insulation layer 5 filling the space between the two conductive films $E_1$ and $E_2$. Whereby, the memory capacitor 3 is formed. The field effect transistor 4 acts as a switch for completing and interrupting the circuit of the memory capacitor 3. An address line 1 deposited on the surface of the insulation layer 5 has a portion which is extended through the insulation layer 5 and electrically connected to the gate electrode G of the field effect transistor 4. Similarly, a data line 2 deposited on the surface of the insulation layer 5 has a portion which is extended through the insulation layer 5 and electrically connected to the drain zone D of the transistor 4.

The one-MOS dynamic memory cell of FIG. 2 operates as follows: Namely, to write a bit or information in the memory cell, an address voltage is applied to the address line 1, so as to turn on the field effect transistor 4, and a bit or information in the form of charge on the data line 2 is transferred to the memory capacitor 3 through the now closed switch of the field effect transistor 4. Whereby the bit or information is written in the memory capacitor 3 as an electric charge stored therein. To read out the stored bit or information from the memory capacitor 3, the address voltage is applied to the address line 1, so that the field effect transistor 4 is turned on, and the electric charge stored in the memory capacitor 3 flows onto the data line 2 through the now closed switch of the field effect transistor 4.

In the integrated memory devices of the prior art, a large number of the one-MOS dynamic memory cells of the above structure are disposed on the surface of a substrate, such as a silicon semiconductor substrate, in a two-dimensional fashion. Hence, the wiring for interconnecting memory cells on the substrate has to extend in two-dimensional routes along interstices between adjacent memory cells. Accordingly, such wiring had to be lengthy and a comparatively long time delay in the signal transmission was inevitable.

Figure 1A:
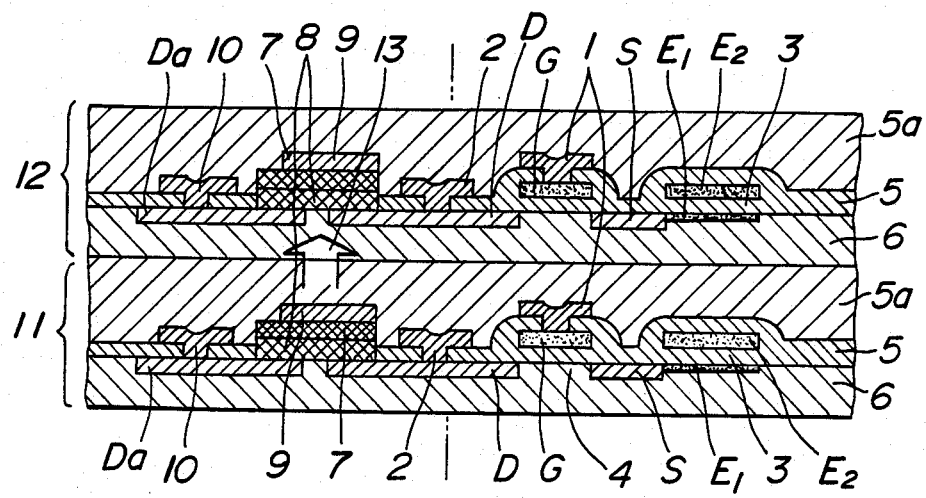
FIG. 1A is a schematic sectional view of a three-dimensional integrated device with optically coupled shared memories according to the present invention.
Figure 1B:
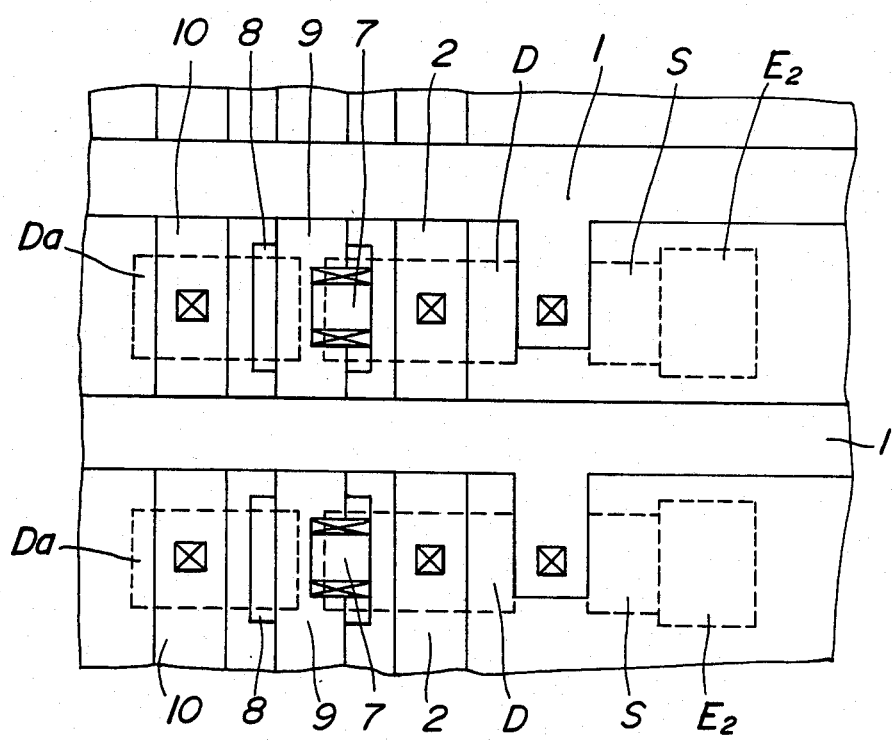
FIG. 1B is a plan view of the three-dimensional integrated device of FIG. 1A.
Figure 1C:
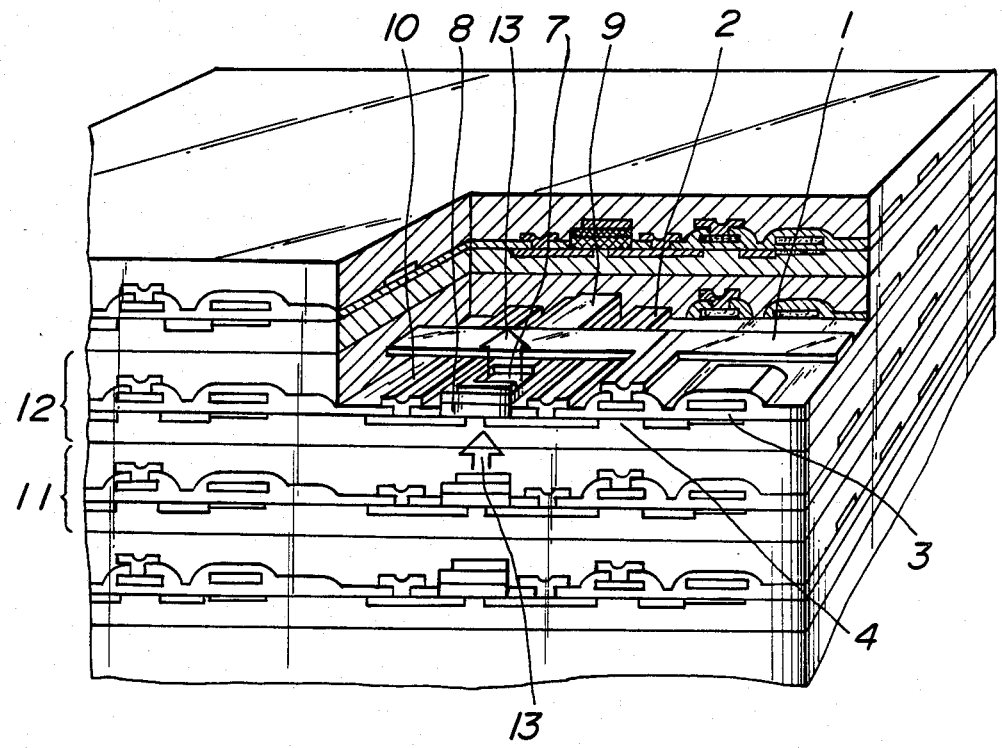
FIG. 1C is a partially cutaway perspective view of the three-dimensional integrated device of FIG. 1A.

The invention is based on the above structure of the one-MOS dynamic memory cell, but the invention avoids the comparatively long time delay by overlaying the two-dimensional integrated memory devices one over the other so as to form a three-dimensional integration with optically coupled shared memories. FIG. 1A shows a schematic sectional view of such three-dimensional integration, while FIG. 1B and FIG. 1C show a plan view and a partially cutaway perspective view thereof. Like parts to those of FIG. 2 are designated by like numerals and symbols.

As can be seen from a comparison of FIG. 1A and FIG. 2, the three-dimensional integration of the invention comprises a number of two-dimensional integrated memory layers carrying memory cells, which memory cells are similar to the conventional one-MOS dynamic cells described above but modified to the extent necessary for fulfilling the purpose of the invention.

The modification applied to the conventional two-dimensional integration of the one-MOS memory cell of FIG. 2 is as follows: Namely, in the individual two-dimensional integrated memory layer to be overlaid one over the other to form the three-dimensional integrated device of the invention, a very thin semiconductor layer such as a silicon semiconductor film is used as the substrate 6. While formulating the individual one-MOS dynamic memory cells as in the case of FIG. 2, a conductive zone $D_a$ is formed at a surface portion of the substrate 6 with a spacing from the drain zone D of the transistor 4 in such a manner that the surface of the conductive zone $D_a$ is flush with both the original surface of the substrate 6 and the surface of the drain zone D as shown in FIG. 1A. The formation of the conductive zone $D_a$ can be effected by similar doping as that of the drain zone D.

To provide an optical coupling to each memory cell, a combination of a light emitting element and a light-sensitive switch element is provided for each memory cell. More particularly, a light-sensitive switch element 8 is deposited on the surface of the substrate 6 so as to bridge the drain zone D and the conductive zone $D_a$. A light emitter element 7 and a data-transfer line 9 are successively deposited on the light-sensitive switch element 8. The surface of the substrate 6 is covered by the insulation layer 5, such as a layer of silicon oxide ($SiO_2$), in such a manner that the above one-MOS dynamic memory cell is formed therein as in the case of FIG. 2. A data-copy line 10 is deposited on the insulation layer 5 so that a part thereof extends through the insulation layer 5 and comes in contact with the conductive zone $D_a$. Another transparent insulation layer 5a made of, for instance, silicon oxide ($SiO_2$) covers the two-dimensional integration on the substrate 6, so as to form one memory layer, such as the (i−1)th memory layer 11, of the three-dimensional integration.

The memory cells of the above structure with the corresponding optical combinations are deposited on the substrate 6 in a two-dimensional fashion, as shown in FIG. 1B. Other memory layers, such as an ith memory layer 12, is made in the same manner as the above-mentioned (i−1) memory layer, and a plurality of such memory layers are overlaid one over the other while accurately aligning the optical combinations consisting of the light emitter elements 7 and the light-sensitive switch elements 8, as shown in FIG. 1A and FIG. 1C. The data-transfer line 9 and the data-copy line 10 form a kind of bias line means to actuate the above optical combinations for the purpose of optical coupling between adjacent memory layers.

Accordingly, light 13 emitted from one of the light emitter elements 7, such as the emitter element 7 on the (i−1)th memory layer 11, passes through the transparent insulation layer 5a and the very thin substrate 6 of the adjacent memory layer, such as the adjacent memory layer 12, and becomes incident to the light-sensitive switch element 8 of the adjacent memory layer, so as to optically couple the two memory layers, as shown in FIG. 1A. Whereby, the memory cells on the adjacent memory layers 11 and 12 are optically coupled through a minimum distance, and signals can be transmitted therebetween very quickly.

The light emitter element 7 to be used in the device of the invention can be made of, for instance, a gallium arsenide (GaAs) film with a p-n junction. The light-sensitive switch element 8 can be made of, for instance, a germanium film. For example, when the data-transfer line 9 on the (i−1)th memory layer 11 applies a forward bias voltage to the p-n junction of the light emitter element 7, the emitter element 7 emits the light 13 toward the adjacent memory layer 12. The light-sensitive switch element 8 of the ith memory layer 12 aligned with the above-mentioned light emitter element 7 of the (i−1)th memory layer receives the light 13 therefrom, and pairs of electrons and holes are generated therein, so that the switch element 8 becomes conductive. Thus, the light-sensitive switch element 8 acts as an optically actuated switch.

Referring to FIG. 1A, when the light 13 emitted from the light emitter element 7 on the lower memory layer 11 travels toward the light-sensitive switch element 8 of the upper memory layer 12 through the insulation layer 5a and the substrate 6, the transparent insulation layer 5a made of, for instance, silicon oxide ($SiO_2$), absorbs the light 13 very little but the substrate 6 made of, for instance, a thin silicon semiconductor film absorbs a part of the light 13 because the material of the substrate 6 is inherently opaque. However, the rate of light absorption at the substrate 6 is comparatively low. In fact, when the thickness of the silicon semiconductor substrate 6 is 1 μm, or $10^{-4}$ cm, such silicon semiconductor substrate 6 absorbs only about 6% of the light 13 passing therethrough. Accordingly, light absorption by the substrate 6 and the insulation layer 5a does not cause any difficulties for practical purposes.

On the other hand, when the light-sensitive switch element 8 is made of germanium film with a thickness of 0.4 μm, or $4\times 10^{-5}$ cm, such switch element 8 absorbs 70% of the incident light, so that the light is efficiently absorbed thereby.

Various elements on each memory layer in the three-dimensional integration of the invention can be formed by the molecular beam epitaxial method with suitable patterning.

The operation of the three-dimensional integrated device with optically coupled shared memories with the structure as shown in FIGS. 1A, 1B, and 1C will be described now, with emphasis on storing data in and copying data from the memory.

To selectively write a datum in a specific memory capacitor 3 on the (i−1)th memory layer 11, a voltage is applied to that address line 1 which is connected to the specific memory capacitor 3, so as to turn on the MOS type field effect transistor 4 for the memory capacitor 3. Whereby, the datum on the data-line 2 is delivered to and stored in the memory capacitor 3 through the transistor 4 in the same manner as in the case of the conventional one-MOS type dynamic memory cell of FIG. 2. At the time of such writing of the datum in the (i−1)th memory layer 11, the same datum as being stored in the (i−1)th memory layer can be copied and written in the corresponding memory capacitor 3 of the adjacent ith memory layer 12 through the above-mentioned optical coupling.

More specifically, when the datum is being written in the specific memory capacitor 3 of the (i−1)th memory layer 11, a suitable voltage is applied to the data-transfer line 9 of the memory layer 11, so that as the datum voltage is applied to the data line 2 and the drain zone D, one-side surface of the light emitter element 7 is directly exposed to the voltage of the data-transfer line 9 while the opposite surface of the light emitter element 7 is exposed to the voltage of the drain zone D through the light-sensitive switch element 8. As a result, the light emitter element 7 emits light 13 toward the adjacent memory layer 12.

In the illustrated embodiment, the data-transfer line 9 is partially notched at a position immediately above the light emitter element 7, so as to allow the light 13 from the light emitter element 7 propagates without being disturbed by the data-transfer line 9. Simultaneously with the application of the voltage on the data-transfer line 9, suitable voltages are applied to those address line 1 and the data-copy line 10 on the data-receiving memory layer, or the ith memory layer 12 in this case, which are immediately above the last mentioned light emitter element 7 of the memory layer 11, so that the MOS field effect transistor 4 for the data-receiving memory cell on the memory layer 12 is made conductive.

Under the above-mentioned conditions with the address voltages applied to the aligned address lines 1 on the adjacent memory layers 11 and 12 and a suitable voltage applied to the data-copy line 10 of the ith memory layer 12, if a datum signal voltage is applied to the data line 2 of the (i−1)th memory layer 11, the datum is written in the memory capacitor 3 on the memory layer 11 and at the same time the light emitter element 7 emits light 13 in response to each application of the datum signal voltage on the data line 2, so that the light-sensitive switch element 8 on the ith memory layer 12 receiving the light 13 becomes conductive in synchronism therewith. Since the suitable voltage is on the data-copy line 10 which is connected to the light-sensitive switch 8 through the conductive zone $D_a$, each time the light-sensitive switch element 8 becomes conductive, the voltage on the data-copy line 10 is further applied to the drain zone D through the conductive zone $D_a$ and the switch element 8.

Such application of the voltage to the drain zone D from the switch element 8 is equivalent to the voltage thereto from the data line 2 on the ith memory layer 12. Since the MOS type field effect transistor 4 on the ith memory layer 12 is now conductive due the presence of the voltage on the address line 1 thereof, the voltage on the drain zone D is stored in the memory capacitor 3 of the ith memory layer 12. Accordingly, the same datum as that of the datum signal voltage applied to the data line 2 of the (i−1)th memory layer 11 is copied and stored in the memory capacitor 3 of the adjacent ith memory layer 12.

Figure 3:
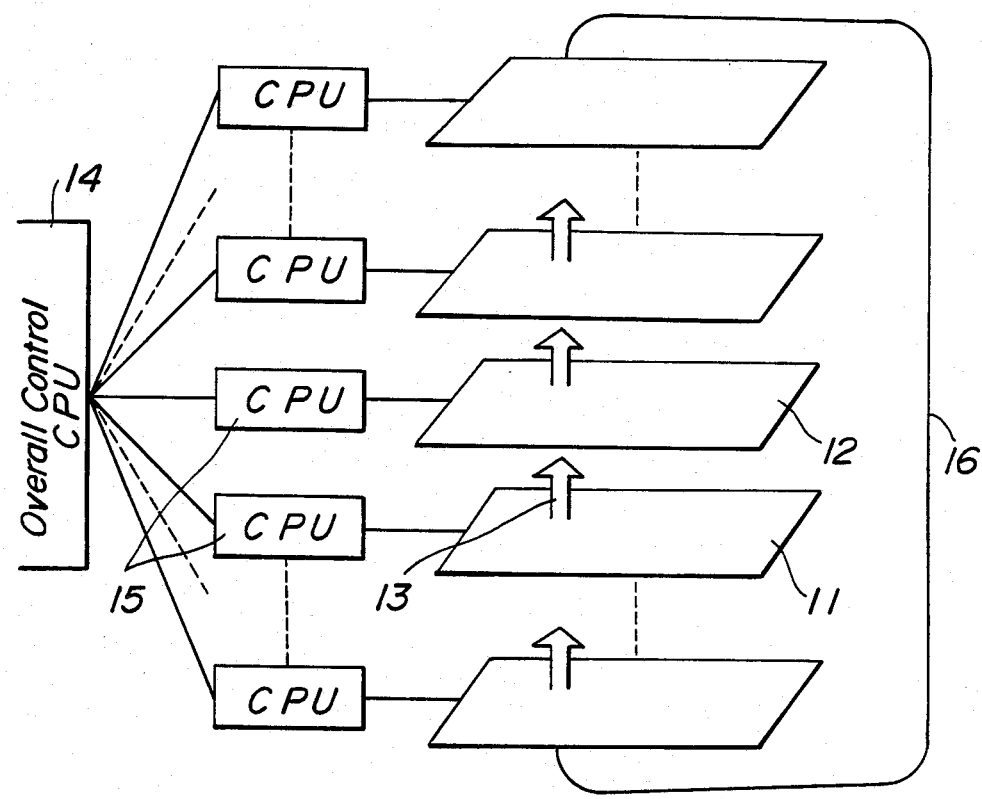
FIG. 3 is schematic block diagram showing the manner in which parallel processing operations are effected by using the different memory layers in the three-dimensional integrated device with optically coupled shared memories according to the invention.

Referring to FIG. 3, various memory layers, such as the memory layers 11 and 12, of the three-dimensional integrated device with optically coupled shared memories according to the invention can be provided with individual central control units (CPU) 15, so that the data stored in the memory cells of each memory layer can be processed by the CPU 15 of that memory layer. When the adjacent memory layers carry data which are copied therebetween, parallel processing of the similar data can be effected by such CPU 15 connected to the individual memory layers. An overall control CPU 14 coordinates the operations of the individual CPU's 15 for the individual memory layers, so as to systematize the above parallel processings of the similar data.

In the three-dimensional integrated device of the invention, each memory layer emanates upward beams of the light 13 for coupling with the immediately above memory layer and for parallel operations using a number of memory layers. The top memory layer is not coupled with the bottom layer in the example of FIG. 1C. However, if it is desired to provide an optical coupling from the top memory layer of the three-dimensional integrated device to the bottom memory layer thereof, a conventional optical loop 16 may be connected between them, as shown in FIG. 3.

In the above explanation, the light emitter element 7 is disposed on the light-sensitive switch element 8, so that each memory layer responds only to that light 13 which comes from below. However, it is also possible to dispose the light-sensitive switch element 8 above the light emitter element 7, so that the light 13 emanates downward for allowing the copying from the memory layer above. It is also possible to simulataneously effect the above-mentioned copying operations on different memory layers, so as to simultaneously copy one datum stored in a particular memory capacitor 3 onto a plurality of memory capacitors 3 in different memory layers which are successively overlaid on the memory layer carrying the first mentioned memory capacitor 3.

In such simultaneous copying to successively overlaid memory layers, it is possible to selectively omit the copying at any memory layers by applying no address voltage to the address lines 1 of such memory layers where copying is not desired. Even when the address voltage is not applied in a particular memory layer, the light-sensitive switch element 8 and the light emitter element 7 of such memory layer act to relay the light 13 to the next succeeding memory layer.

Certain examples of the semiconductor materials for certain constituent parts of the device of the invention have been referred to in the foregoing, but the invention is not restricted to the above-mentioned materials. In fact, the device of the invention can be fabricated by using any suitable materials as long as they meet the needs of the invention. For instance, the semiconductor for the substrate 6 is not restricted to silicon, but the substrate 6 can be made of a compound semiconductor of III-V group elements, such as GaAAs system compound semiconductors, a multilayered structure made of a combination of such compound semiconductors, amorphous semiconductor films, and the like.

The insulation layers 5 and 5a can be made of materials other than silicon oxide ($SiO_2$), such as various insulation materials which have been used conventionally in integrated circuits, and semi-insulating semiconductor materials without any doping of impurities. The light emitter element can be made of a combination of compound semiconductors of III-V group elements and II-IV group elements with hetero junctions, or a combination of amorphous semiconductors, provided that the semiconductor material of the light emitter element has a larger energy gap than that of the light sensitive switch element. Various materials mentioned above can be shaped into the constituent parts of the device of the invention by any of conventional vapor growth methods or liquid growth methods.

As described in the foregoing, a three-dimensional integrated device with optically coupled shared memories according to the invention uses combinations of the light emitter elements and the light-sensitive switch elements so as to optically coupled adjacent memory layers thereof, whereby time delay in signal transmission in the integrated device is substantially minimized by simple circuit formation. With the three-dimensional integrated device according to the invention, parallel operations for high-speed data processing can be effected efficiently, so that the device of the invention is particularly useful in those information processing techniques which must use parallel operations on information, such as graphic data processing and voice recognition and other pattern recognitions.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A three-dimensional integrated device with optically coupled shared memories, comprising a plurality of memory layers overlaid one over the other with insulating layers inserted between adjacent memory layers, each of said memory layers having a plurality of memory cells, each cell made of a capacitor switchable by a transistor, address lines associated with said memory cells respectively, each address line being connected to said transistor of the associated cell so as to selectively make the transistor conductive, and data lines connected to said transistors, each data line carrying a datum in the form of presence and absence of charge transferable to and from said cell through said transistors; optical combinations juxtaposed to said cells, each optical combination made of a light emitter element and a light-sensitive switch element, said optical combinations of adjacent memory layers being visibly aligned; and bias line means associated with each optical combination and adapted to be selectively actuated so as to cause said light emitter element to emit light depending on datum stored in the corresponding cell and to cause said light-sensitive switch to close circuit thereof upon receiving light from adjacent memory layer, whereby said datum in the cell of one memory layer is copied onto the corresponding cell of adjacent memory layer.

2. A three-dimensional integrated device as set forth in claim 1, wherein said transistor of the memory cell is a field effect transistor having a source connected to said capacitor, a gate connected to said address line, and a drain connected to said data line; said bias line means has a data-transfer line facing said drain of the transistor of the corresponding cell, and a data-copy line connected to one terminal of said light-sensitive switch element, opposite terminal of said light-sensitive switch element being connected to said drain, said light emitter element being disposed between said data-transfer line and said drain so as to emit light when both said data-transfer line and said drain are charged, said data-copy line carrying a datum to be transferred to the corresponding cell only when said light-sensitive switch element closes circuit between terminals thereof.

3. A three-dimensional integrated device as set forth in claim 2, wherein said memory layer has a silicon semiconductor substrate.

4. A three-dimensional integrated device as set forth in claim 2, wherein said insulating layer between adjacent memory layers is made of transparent silica ($SiO_2$).

5. A three-dimensional integrated device as set forth in claim 2, wherein said light-sensitive switch element is disposed between said data-transfer line and said drain.

6. A three-dimensional integrated device as set forth in claim 2, wherein said data-copy line is connected to said light-sensitive switch element through a conductive area formed on substrate of said memory layer by doping.

7. A three-dimensional integrated device as set forth in claim 2, wherein said light emitter element is made of a layer of gallium arsenide (GaAs).

8. A three-dimensional integrated device as set forth in claim 2, wherein said light-sensitive switch element is made of a layer of germanium.

* * * * *